(12) United States Patent
Zhang

(10) Patent No.: US 8,618,806 B2
(45) Date of Patent: Dec. 31, 2013

(54) CIRCUITS AND METHODS FOR CELL NUMBER DETECTION

(75) Inventor: Wei Zhang, Shanghai (CN)

(73) Assignee: O2Micro, Inc., Santa Clara, CA (US)

( * ) Notice: Subject to any disclaimer, the term of this patent is extended or adjusted under 35 U.S.C. 154(b) by 671 days.

(21) Appl. No.: 12/886,261

(22) Filed: Sep. 20, 2010

(65) Prior Publication Data
US 2012/0007603 A1  Jan. 12, 2012

(30) Foreign Application Priority Data
Jul. 8, 2010 (CN) .......................... 2010 1 0222621

(51) Int. Cl.
G01N 27/416 (2006.01)
H02J 7/00 (2006.01)
(52) U.S. Cl.
USPC .......................................... 324/434; 320/116
(58) Field of Classification Search
USPC .......................................... 324/433; 320/116
See application file for complete search history.

(56) References Cited

U.S. PATENT DOCUMENTS

| | | | |
|---|---|---|---|
| 5,631,537 A | 5/1997 | Armstrong | |
| 5,694,023 A | 12/1997 | Podrazhansky et al. | |
| 5,973,480 A * | 10/1999 | Takano et al. | 320/152 |
| 6,639,408 B2 | 10/2003 | Yudahira et al. | |
| 7,095,211 B2 | 8/2006 | Denning | |
| 7,280,333 B2 * | 10/2007 | Horsky et al. | 361/93.1 |
| 7,492,122 B2 * | 2/2009 | Hofer | 320/106 |
| 7,521,896 B2 * | 4/2009 | Yudahira et al. | 320/133 |
| 7,973,515 B2 | 7/2011 | Densham et al. | |
| 7,990,276 B2 * | 8/2011 | Cruise | 340/636.2 |
| 8,198,835 B2 * | 6/2012 | Yokoyama et al. | 318/139 |
| 2002/0140404 A1 * | 10/2002 | Lyden | 320/166 |
| 2007/0252555 A1 * | 11/2007 | Potempa | 320/116 |
| 2008/0012570 A1 | 1/2008 | Bucur | |
| 2009/0237032 A1 * | 9/2009 | Nam et al. | 320/116 |
| 2009/0237035 A1 * | 9/2009 | Kung et al. | 320/162 |
| 2010/0045238 A1 * | 2/2010 | Jau et al. | 320/128 |
| 2010/0259270 A1 * | 10/2010 | Senriuchi et al. | 324/429 |

FOREIGN PATENT DOCUMENTS

| | | |
|---|---|---|
| CN | 1352398 A | 6/2002 |
| CN | 1536829 A | 10/2004 |
| CN | 1182406 C | 12/2004 |
| CN | 101158710 A | 4/2008 |
| CN | 101604860 A | 12/2009 |
| JP | H0965576 A | 3/1997 |
| TW | 342452 | 10/1998 |
| TW | I250299 B | 3/2006 |
| TW | I303720 B | 12/2008 |
| TW | 201008077 A | 2/2010 |

* cited by examiner

*Primary Examiner* — Drew A Dunn
*Assistant Examiner* — Michael Dibenedetto

(57) ABSTRACT

A circuit used for determining a cell number of several battery cells. The circuit includes a detection block and a controller, and operates in a first detection mode and a second detection mode. The detection block is coupled to each of the battery cells. In the first detection mode, the detection block provides a terminal voltage signal indicative of a terminal voltage of a battery cell. In the second detection mode, the detection block provides a cell voltage signal indicative of a cell voltage of the battery cell. The controller compares the terminal voltage signal with a first threshold in the first detection mode and compares the cell voltage signal with a second threshold in the second detection mode, and provides a cell count signal indicative of the cell number based on the terminal voltage signal and the cell voltage signal.

20 Claims, 8 Drawing Sheets

CIRCUITS AND METHODS FOR CELL NUMBER DETECTION

RELATED APPLICATION

This application claims priority to Patent Application No. 201010222621.6, titled "Circuits and Methods for Cell Number Detection and Management System," filed on Jul. 8, 2010, with the State Intellectual Property Office of the People's Republic of China.

BACKGROUND

Multi-cell rechargeable batteries are utilized in many applications because of their relatively high capacity. Such applications include, but are not limited to, electronic devices such as laptops, cellular phones, personal digital assistants, and the like. Certain types of battery packs, e.g., a Lithium ion (Li-ion) battery, can provide various power supply voltages adapted for various power voltage applications by using battery cells of different cell numbers. For example, a Li-ion battery can be used to provide different voltages in many power supply applications, such as 10.8 V (by using 3 cells), 14.4 V (by using 4 cells), 18 V (by using 5 cells), and 21.6 V (by using 6 cells), etc. As such, a battery management integrated circuit (IC) for monitoring and protecting the battery pack need to be configured properly to support the battery pack of different cell numbers.

Some traditional methods to configure the battery management IC include one time programmable (OTP) configuration, microprocessor control unit (MCU) configuration, and additional pin configuration. Referring to FIG. 1, a battery management IC 102 in accordance with the conventional OTP configuration is illustrated. The battery management IC 102 is integrated with an OTP memory 104. Usually, automated test equipment 106 configures the OTP memory 104 during a chip testing period so as to make the battery management IC 102 support a specific battery cell number. However, after the configuration, the battery management IC 102 may not support the batteries having other cell numbers.

Referring to FIG. 2, a battery management IC 202 in accordance with the conventional MCU configuration is illustrated. Information of the battery cell number is stored in a MCU 206 which configures a register 204 in the battery management IC 202. When the battery management IC 202 powers on, the cell number information is written into the register 204 by the MCU 206. The battery management IC 202 can support more different cell numbers, but the MCU 206 requires software and the cost is relatively expensive.

Referring to FIG. 3, a battery management IC 302 in accordance with the conventional additional pin configuration is illustrated. Several pins of the battery management IC 302 are used for configuring the battery management IC 302. In FIG. 3, the battery management IC 302 includes two configuration pins 304 and 306, which can be tied to different voltage levels, to indicate the cell numbers supported by the battery management IC 302. For example, when the configuration pin 304 is tied to a source voltage (VDD) and the configuration pin 306 is tied to a ground voltage (VSS), the supported cell number is, e.g., 5. When the configuration pins 304 and 306 are both tied to VSS, the cell number is 3; when the pins 304 and 306 are both tied to VDD, the cell number is 6. However, in order to support different numbers of battery cells, layout of the printed circuit board (PCB, not shown in FIG. 3), which the battery management IC 302 is fixed onto, needs to be modified to tie configuration pins 304 and 306 to different voltage levels.

SUMMARY

A circuit used for determining a cell number of several battery cells. The circuit includes a detection block and a controller, and can operate in a first detection mode and a second detection mode. The detection block is coupled to each of the battery cells. In the first detection mode, the detection block provides a terminal voltage signal indicative of a terminal voltage of a battery cell. In the second detection mode, the detection block provides a cell voltage signal indicative of a cell voltage of the battery cell. The controller compares the terminal voltage signal with a first threshold in the first detection mode and compares the cell voltage signal with a second threshold in the second detection mode, and provides a cell count signal indicative of the cell number based on the terminal voltage signal and the cell voltage signal.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, a cell number detection circuit is provided to detect a cell number of N battery cells and generate a cell count signal to indicate the number N. Thus, the battery power management IC can flexibly support different numbers of battery cells applications. Furthermore, based on the number N of the battery cells, battery cell monitoring and protection functions can be realized accordingly.

Figure 1:
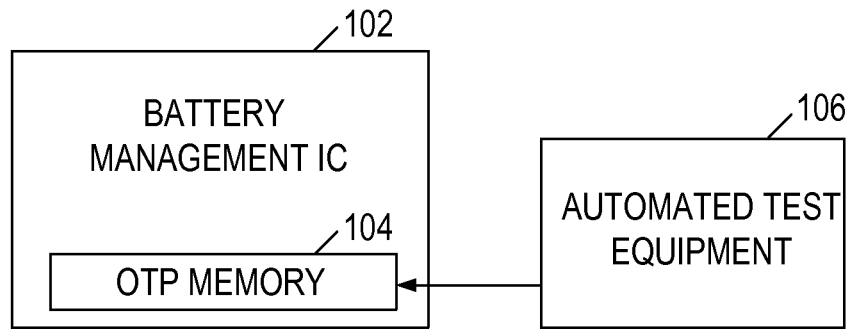
FIG. 1 is a diagram showing a conventional battery management IC configured by the OTP configuration.
Figure 2:
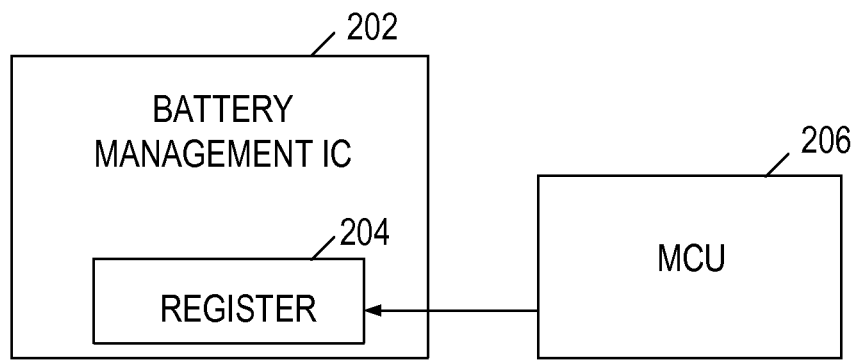
FIG. 2 is a diagram showing another conventional battery management IC configured by the MCU configuration.
Figure 3:
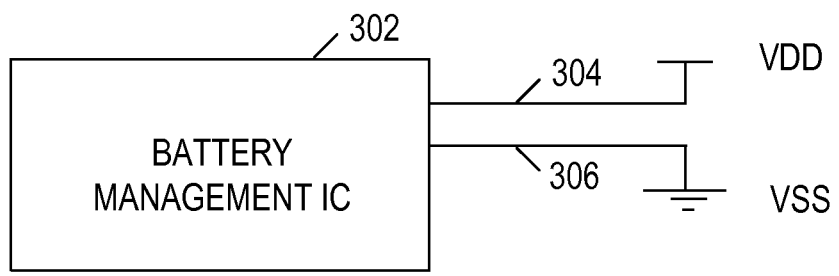
FIG. 3 is a diagram showing another conventional battery management IC configured by the additional pin configuration.
Figure 4:
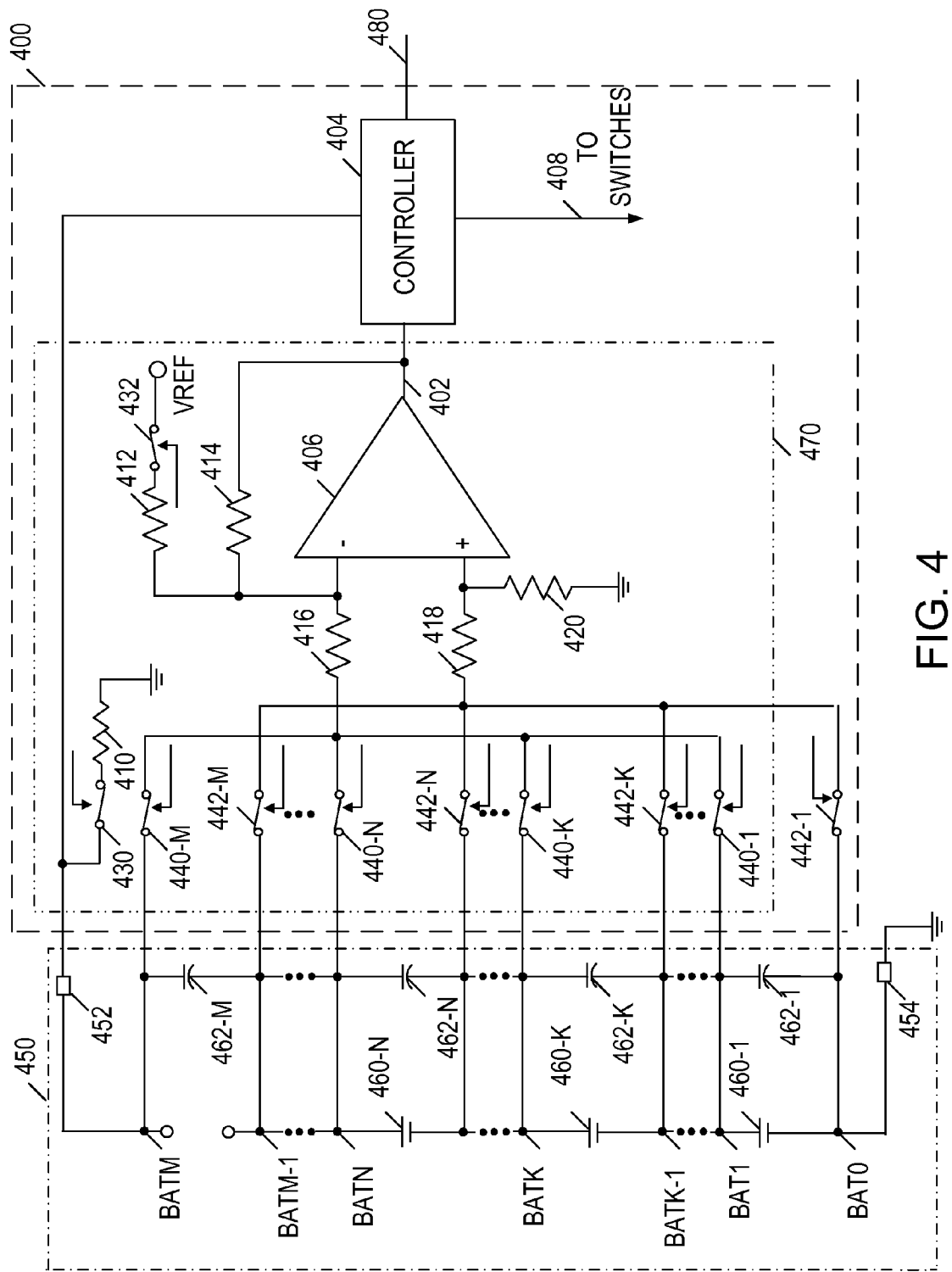
FIG. 4 is a diagram showing a detection circuit, in accordance with one embodiment of the present invention.

FIG. 4 shows a detection circuit 400 to detect a cell number N of battery cells according to one embodiment of the present invention. In one embodiment, the battery cells are assembled into a battery pack 450, which can accommodate M battery cells, where M is an integer. The M battery cells can be coupled in series to form M+1 cell nodes $BAT_0$ through $BAT_M$. If the M battery cells are coupled in series in the battery pack 450, the voltage levels of the cell nodes $BAT_0$ through $BAT_M$ are increased sequentially. The battery pack 450 further includes pack terminals 454 and 452. The cell node $BAT_0$ is coupled to the pack terminal 454, and the cell node $BAT_M$ is coupled to the pack terminal 452. In one embodiment, the battery pack 450 further includes M filter capacitors 462-1 through 462-M, which are coupled in parallel with the M battery cells, respectively. In the example of FIG. 4, the battery pack 450 includes N battery cells 460-1 through 460-N coupled in series, where N=1, 2 . . . M.

The detection circuit 400 is coupled to the battery pack 450 to detect the cell number N of the battery cells and to provide a cell count signal 480 indicative of the cell number N. In one embodiment, the detection circuit 400 includes a detection block 470 and a controller 404. The detection circuit 400 provides the cell count signal 480 indicative of the cell number N after going through at least one round of cell number detection. In each cell number detection round, the controller 404 selects a battery cell in the battery pack 450. The detection block 470 detects the selected battery cell and outputs a status signal 402. Based on the status signal 402, the controller 404 either provides the cell count signal 480 or continues to select a new battery cell. As the new battery cell is selected, a new cell number detection round begins. The cell number detection round repeats, until the controller 404 provides the cell count signal 480 based on the status signal 402.

In one embodiment, the detection block 470 includes an operational amplifier 406, resistors 410, 412, 414, 416, 418 and 420, a pre-discharging switch 430, a reference switch 432, a first group of detecting switches 440-1 through 440-M, and a second group of detecting switches 442-1 through 442-M. In one embodiment, the switches in the detection block 470 are controlled by the controller 404 via control signals (CTLs) 408. Each control signal controls a conduction state of one of the switches in the detection block 470. An inverting input of the operational amplifier 406 receives a reference voltage $V_{REF}$ through the resistor 412 and the reference switch 432. The inverting input of the operational amplifier 406 is further coupled to the first group of detecting switches 440-1 through 440-M via the resistor 416. A non-inverting input of the operational amplifier 406 is coupled to ground through the resistor 420. The non-inverting input of the operational amplifier 406 is further coupled to the second group of detecting switches 442-1 through 442-M via the resistor 418.

The resistor 414 is coupled between the inverting input and an output terminal of the operational amplifier 406. The pre-discharging switch 430 and the resistor 410 are coupled in series between the pack terminal 452 and ground.

In one embodiment, a $K^{th}$ detecting switch 440-K is coupled to the inverting input of the operational amplifier 406 through the resistor 416 and to a $(K+1)^{th}$ cell node $BAT_K$ which is a positive terminal of the $K^{th}$ battery cell, where K is an integer and K=1, 2, . . . M. A $K^{th}$ detecting switch 442-K is coupled to the non-inverting input of the operational amplifier 406 through the resistor 418 and to a $K^{th}$ cell node $BAT_{K-1}$ which is a negative terminal of the $K^{th}$ battery cell. The controller 404 controls statuses of the first and second groups of detecting switches to monitor a status of a corresponding battery cell from the battery pack 450. For example, to monitor the status of the $K^{th}$ battery cell, the controller 404 controls the detecting switches 440-K and 442-K via the control signals 408 to couple the $K^{th}$ battery cell to the operational amplifier 406 while the remaining detecting switches are switched off.

Prior to the cell number detection, the controller 404 performs a pre-discharging to avoid pseudo cell detection, e.g., when the remaining charge at one or more of the filter capacitors 462-1 through 462-M is relatively large. During the pre-discharging, the controller 404 switches the pre-discharging switch 430 on and the remaining switches off via the control signals 408. As such, the filter capacitors 462-1 through 462-M are discharged through the pre-discharging switch 430 and the resistor 410. The controller 404 sets a discharging current (e.g., 50 µA) and a time period (e.g. 100 ms) for the pre-discharging, in one embodiment.

During the cell number detection, to detect a status of the $K^{th}$ battery cell, the controller 404 controls the detection circuit 400 in a first detection mode and a second detection mode. In the first detection mode, the controller 404 switches the detecting switch 440-K and the reference switch 432 on and switches the detecting switch 442-K and the pre-discharging switch 430 off. In the second detection mode, the controller 404 switches both the detecting switch 440-K and the detecting switch 442-K on and both the reference switch 432 and the pre-discharging switch 430 off.

In the first detection mode, the cell node $BAT_K$ is coupled to the inverting input of the operational amplifier 406 by switching on the detecting switch 440-K while the cell node $BAT_{K-1}$ is decoupled from the non-inverting input of the operational amplifier 406 by switching off the detecting switch 442-K. As such, a terminal voltage at the cell node $BAT_K$ is provided to the operational amplifier 406. Based on the terminal voltage, the operational amplifier 406 outputs the status signal 402, e.g., a terminal voltage signal $V_{OUT1}$ indicative of the terminal voltage at the cell node $BAT_K$. $V_{OUT1}$ can be calculated according to equation (1):

$$V_{OUT1} = -\left[\frac{R_{414}}{R_{412}} \times V_{REF} + \frac{R_{414}}{R_{416}} \times V_{BATK}\right], \quad (1)$$

where $V_{REF}$ is the reference voltage $V_{REF}$, $V_{BATK}$ is the voltage at the cell node $BAT_K$, $R_{412}$ is the resistance of the resistor 412, $R_{414}$ is the resistance of the resistor 414, and $R_{416}$ is the resistance of the resistor 416. Thus, the terminal voltage signal $V_{OUT1}$ can be calculated and output to the controller 404. The controller 404 compares the terminal voltage signal $V_{OUT1}$ with a first threshold V1 to determine a presence status of the $K^{th}$ battery cell.

In the second detection mode, the cell nodes $BAT_K$ and $BAT_{K-1}$ are coupled to the inverting and non-inverting inputs of the operational amplifier 406 respectively by switching on both the detecting switches 440-K and 442-K. As such, a cell voltage of the $K^{th}$ battery cell is provided to input of the operational amplifier 406. Based on the cell voltage, the operational amplifier 406 outputs the status signal 402, e.g., a cell voltage signal $V_{OUT2}$ indicative of the cell voltage of the $K^{th}$ battery cell. $V_{OUT2}$ can be calculated according to equation (2):

$$V_{OUT2} = -\frac{R_{414}}{R_{416}} \times V_{BATK} + \frac{R_{420}}{R_{418} + R_{420}} \times \frac{R_{414} + R_{416}}{R_{414}} \times V_{BATK-1}, \quad (2)$$

where $V_{BATK-1}$ is the voltage at the cell node $BAT_{K-1}$, $R_{418}$ is the resistance of the resistor 418, and $R_{420}$ is the resistance of the resistor 420. Thus, the cell voltage signal $V_{OUT2}$ can be calculated and output to the controller 404. The controller 404 compares the cell voltage signal $V_{OUT2}$ with a second threshold V2, e.g., 0.5V, to determine the presence status of the $K^{th}$ battery cell.

Furthermore, based on the presence status of the $K^{th}$ battery, the controller 404 either provides the cell count signal 480 or continues to select a new battery cell. As described above, the cell number detection round repeats until the controller 404 provides the cell count signal 480 based on the status signal 402. In each cell number detection round, the controller 404 selects the battery cell from the battery pack 450 according to a predetermined detection sequence. In one embodiment, the predetermined detection sequence is from high voltage side towards low voltage side, which is detailed described in relation to FIG. 5. In another embodiment, the predetermined detection sequence is from low voltage side towards high voltage side, which is detailed described in relation to FIG. 6.

Advantageously, a cell number detection circuit according to the present invention can detect a cell number N of battery cells and generate a cell count signal to indicate the number N while the battery cells are operating. Thus, the battery power management IC can be more flexible to support different numbers of battery cells applications. Furthermore, based on the number N of the battery cells, battery cell monitoring and protection functions can be realized accordingly.

Figure 5:
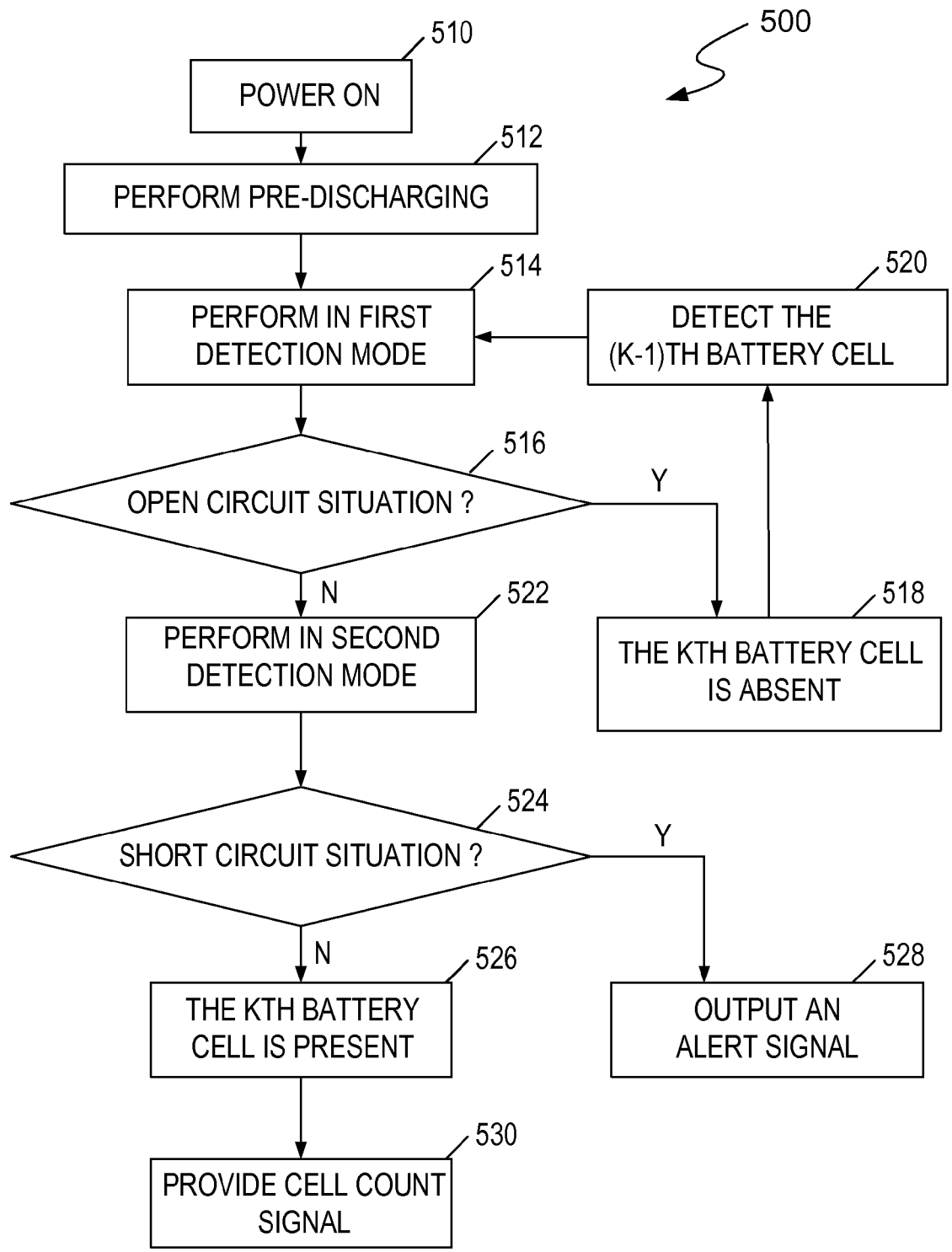
FIG. 5 is a flowchart showing a cell detection performed by the detection circuit of FIG. 4 in one detecting sequence, in accordance with one embodiment of the present invention.

FIG. 5 is a flowchart 500 showing steps of a cell number detection performed by the detection circuit of FIG. 4, in accordance with one embodiment of the present invention. FIG. 5 is described in combination with FIG. 4. As described in relation to FIG. 4, there are N battery cells in the battery pack 450 which is capable of accommodating M battery cells, where N=1, 2, . . . M. In the example of FIG. 5, the controller 404 selects the battery cell from the battery pack 450, starting from the high voltage side towards the low voltage side.

In block 510, the battery pack 450 is coupled to the detection circuit 400 and the detection circuit 400 is powered on. In block 512, the controller 404 switches the pre-discharging switch 430 on to perform the pre-discharging, which prevents the detection circuit 400 from pseudo cell detection.

In block 514, the controller 404 selects a battery cell 460-K. In the example of FIG. 5, K is set to M to begin the first cell number detection round with the cell at the high voltage side. The controller 404 further switches on the detecting switch 440-K and the reference switch 432 and switches off the detecting switch 442-K and the pre-discharging switch 430. As such, the detection circuit 400 operates in the first detection mode, in which the detection block 470 outputs the terminal voltage signal $V_{OUT1}$ indicative of the terminal voltage at the cell node $BAT_K$.

In block 516, the controller 404 compares the terminal voltage signal $V_{OUT1}$ with the first threshold to determine the presence status of the battery cell 460-K. Assuming that the reference voltage $V_{REF}$ is 1V and resistances of the resistors 412, 414 and 416 are equal, the first threshold is set to −1.5V. If the terminal voltage signal $V_{OUT1}$ is less than the first threshold, an open circuit condition is detected at the cell node $BAT_K$. In this instance, the cell node $BAT_K$ is determined to be floating and the battery cell 460-K is determined to be absent, in block 518. In block 520, the controller 404 selects the battery cell 460-(K−1) and the flowchart 500 goes back to block 514 to start a new cell number detection round.

However, if the terminal voltage signal $V_{OUT1}$ is greater than the first threshold, the controller 404 switches on the detecting switches 442-K and 440-K and switches off the reference switch 432 and the pre-discharging switch 430, in block 522. As such, the detection circuit 400 operates in the second detection mode, in which the detection block 470 outputs the cell voltage signal $V_{OUT2}$ indicative of the cell voltage of the battery cell 460-K.

In block 524, the controller 404 compares the cell voltage signal $V_{OUT2}$ with the second threshold to determine the presence status of the battery cell 460-K. In one embodiment, assuming that resistances of the resistors 414, 416, 418 and 420 are equal, the second threshold is set to −0.5V. If the cell voltage signal $V_{OUT2}$ is less than the second threshold, an abnormal condition is detected between the cell nodes $BAT_K$ and $BAT_{K-1}$. For example, the cell node $BAT_K$ and the cell node $BAT_{K-1}$ are short-circuited or the cell voltage of the battery cell 460-K is too low to work properly. In such instance, the controller 404 outputs an alert signal indicative of the abnormal condition, in block 528. If the cell voltage signal $V_{OUT2}$ is greater than the second threshold, the battery cell 460-K is determined to be present, in block 526.

In block 530, the controller 404 calculates the cell number N according to the sequence number K of the battery cell determined to be present and provides the cell count signal 480 indicative of the cell number N. In other words, N is equal to M minus the number of absent battery cells. As the cell number N is acquired, the cell number detection is terminated accordingly. In one embodiment, the controller 404 further selects the battery cell 460-(N+1) so as to monitor insertion of a new battery cell to the battery pack 450 based on the cell count signal 480.

Figure 6:
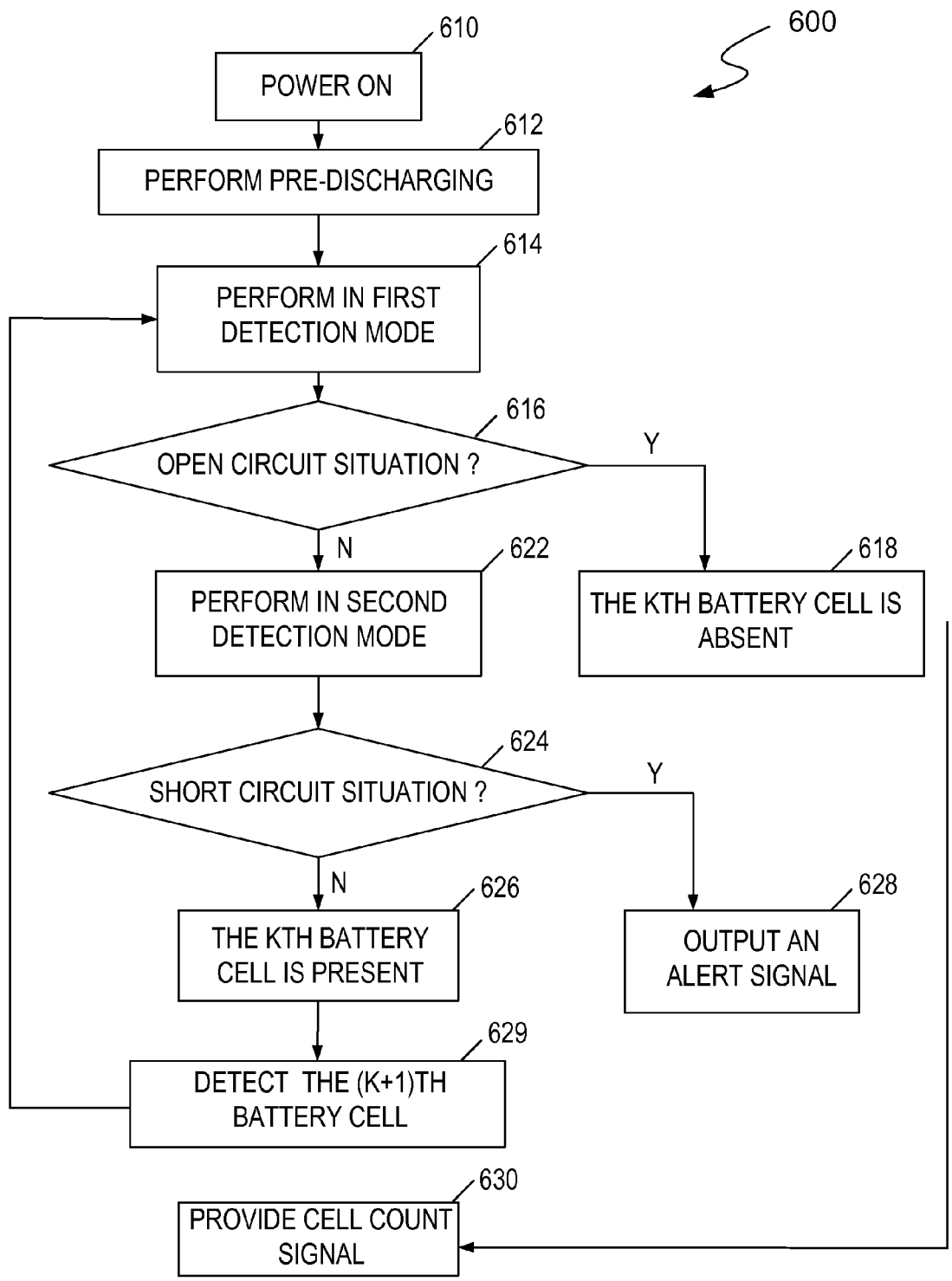
FIG. 6 is a flowchart showing a cell detection performed by the detection circuit of FIG. 4 in another detecting sequence, in accordance with another embodiment of the present invention.

FIG. 6 is a flowchart 600 showing a cell number detection performed by the detection circuit of FIG. 4, in accordance with another embodiment of the present invention. FIG. 6 is described in combination with FIG. 4. In the example of FIG. 6, the controller 404 selects the battery cell from the battery pack 450, starting from the low voltage side battery cell towards the high voltage side. The cell number detection begins with the first battery cell 460-1.

In block 610, the battery pack 450 is coupled to the detection circuit 400 and the detection circuit 400 is powered on. In block 612, the controller 404 performs the pre-discharging, which prevents the detection circuit 400 from pseudo cell detection.

In block 614, the controller 404 selects a battery cell 460-K. In the example of FIG. 6, K is set to 1 to begin the first cell number detection with the cell at the low voltage side. The detection circuit 400 operates in the first detection mode to output the terminal voltage signal $V_{OUT1}$ indicative of the terminal voltage at the cell node $BAT_K$. In block 616, the controller 404 compares the terminal voltage signal $V_{OUT1}$ with the first threshold to determine the presence status of the battery cell 460-K. If the terminal voltage $V_{OUT1}$ is less than the first threshold, the battery cell 460-K is determined to be absent, in block 618.

In block 630, the controller 404 calculates the cell number K according to the sequence number K of the battery cell determined to be absent and provides the cell count signal 480 indicative of the cell number N. The cell number detection is terminated accordingly. In one embodiment, the controller 404 further selects the battery cell 460-(N+1) so as to monitor insertion of a new battery cell to the battery pack 450 based on the count signal 480.

If, however, the terminal voltage signal $V_{OUT1}$ is greater than the first threshold, the controller 404 operates the detection circuit 400 in the second detection mode, in block 622, in which the detection block 470 outputs the cell voltage signal $V_{OUT2}$ indicative of the cell voltage of the battery cell 460-K.

In block 624, the controller 404 compares the cell voltage signal $V_{OUT2}$ with the second threshold to determine the presence status of the battery cell 460-K. If the cell voltage signal $V_{OUT2}$ is less than the second threshold, an abnormal condition detected between the cell nodes $BAT_K$ and $BAT_{K-1}$. In such instance, the controller 404 outputs an alert signal, in block 628. If the cell voltage signal $V_{OUT2}$ is greater than the second threshold, the battery cell 460-K is determined to be present, in block 626.

In block 629, the controller 404 selects the battery cell 460-(K+1) and the flowchart 600 goes back to block 614 to start a new cell number detection round until the cell count signal 408 is generated in block 630.

In one embodiment, the detection block 470 detects the presence statuses of each battery cell in the battery pack 450 to provide the cell count signal 480. In one embodiment, the detection circuit 400 automatically performs a cell number detection for the battery pack 450 once the detection circuit 400 is power on. In another embodiment, the detection circuit 400 can be triggered by a signal, e.g., an under-voltage alert signal provided by a battery management IC which monitors the voltage across the battery pack. For example, if the voltage across the battery pack drops suddenly, which arouses the under-voltage alert signal accordingly, the detection circuit 400 can perform the cell number detection to check the number of present battery cells in the battery pack 450, and determine whether an absent battery cell causes the voltage drop.

Figure 7:
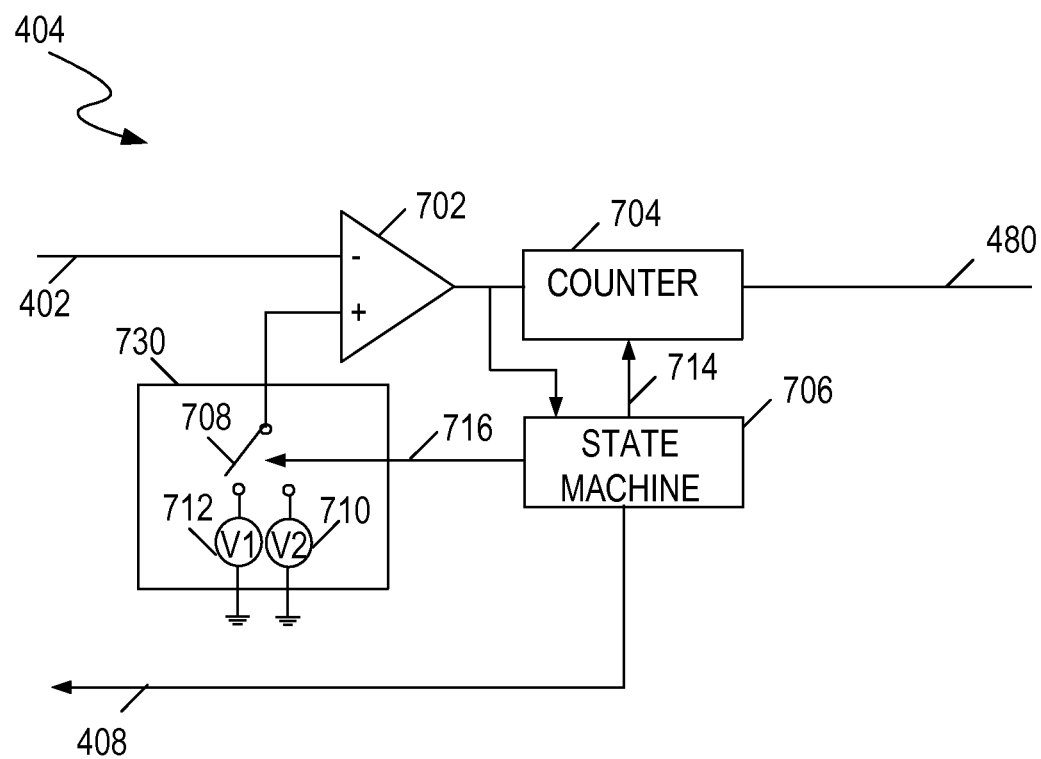
FIG. 7 is a diagram showing a controller in the detection circuit, in accordance with one embodiment of the present invention.

FIG. 7 shows a controller 404 in the detection circuit 400, according to one embodiment of the present invention. FIG. 7 is described in combination with FIGS. 4, 5 and 6. The controller 404 comprises a comparator 702, a counter 704, a state machine 706, and a threshold generator 730 including a multiplexer 708, a voltage source 710, and a voltage source 712. The comparator 702 compares the status signal 402 with the first threshold or the second threshold. The comparison result of the comparator 702 is input to the state machine 706 which provides an internal control signal 716 to the multiplexer 708, outputs the control signals 408, and provides a clock cycle signal 714 to the counter 704 accordingly.

Based on the internal control signal 716, the multiplexer 708 selects the voltage source 712 in the first detection mode and selects the voltage source 710 in the second detection mode. Provided with the clock cycle signal 714, the counter 704 provides the cell count signal 480 according to the comparison result of the comparator 702. More specifically, if the cell number detection starts from the high voltage side towards the low voltage side as described in FIG. 5, the counter 704 counts the number of any absent battery cells detected in block 518 to provide the cell count signal 480 based on the comparison result of the comparator 702 obtained during the first detection mode. If the cell number detection starts from the low voltage side towards the high voltage side as described in FIG. 6, the counter 704 counts the number of present battery cells detected in block 626 to provide the cell count signal 480 based on the comparison result of the comparator 702 obtained during the second detection mode. With the control signals 408, the switches in the detection circuit 400 are switched on/off, allowing the detection circuit 400 to operate according to the flowchart of FIG. 5 or FIG. 6.

In one embodiment, the state machine 706 also provides an alert signal (not shown in FIG. 7) based on the comparison result of the comparator 702 if there is a short circuit condition as described in block 524 and block 624.

Figure 8:
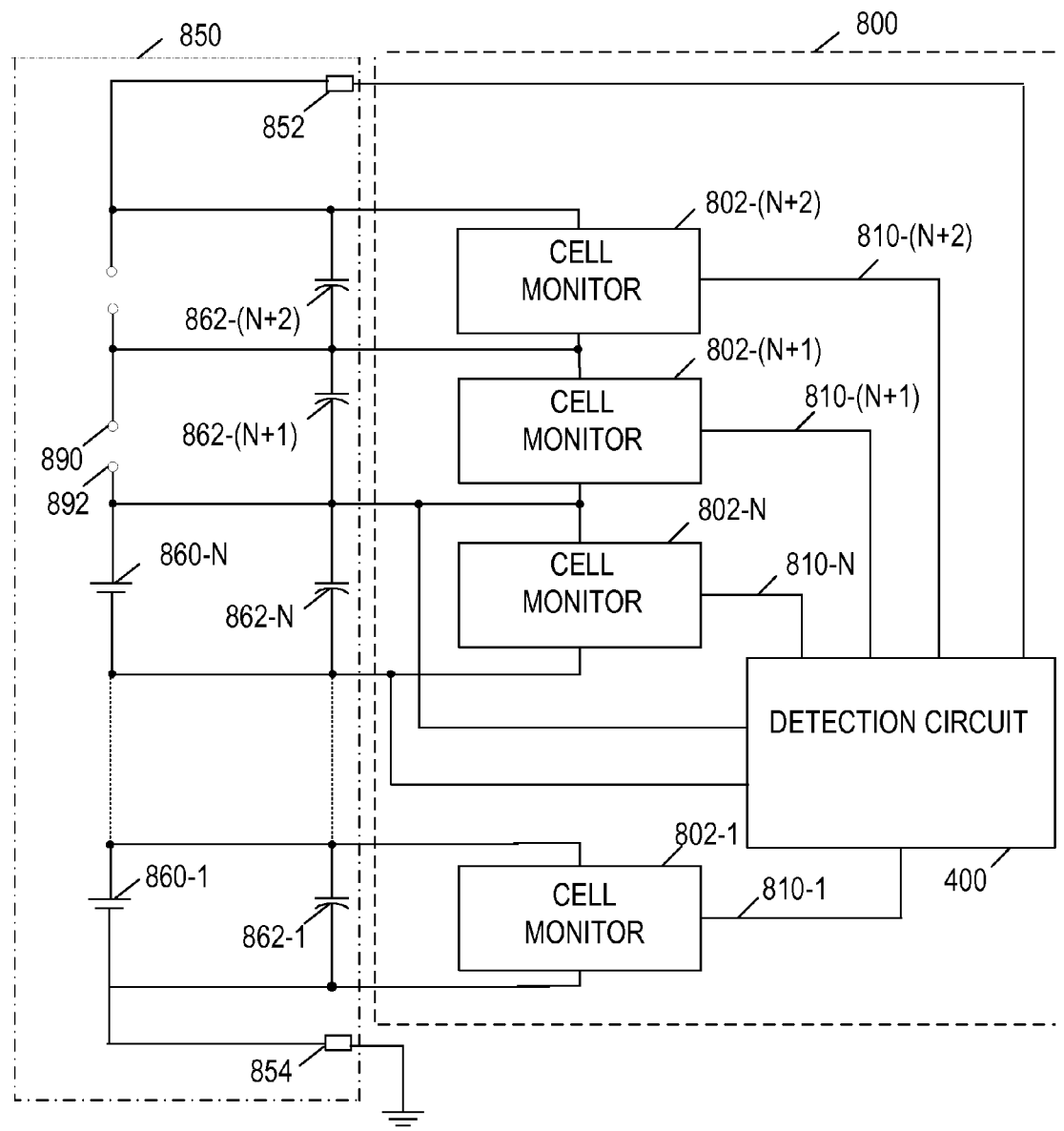
FIG. 8 is a diagram showing a battery management system, in accordance with one embodiment of the present invention.

FIG. 8 shows a battery management system 800, according to one embodiment of the present invention. In the example of FIG. 8, the battery pack 850 can accommodate N+2 battery cells. The cell monitors 802-1 through 802-(N+2) are configured to monitor statuses, e.g., currents, temperatures of corresponding battery cells, respectively. The detection circuit 800 provides cell monitor control signals 810-1 through 810-(N+2) to enable or disable the cell monitors 802-1 through 802-(N+2).

In the example of FIG. 8, the battery pack 850 includes N battery cells 860-1 through 860-N coupled in series, and pack terminals 854 and 852. At the terminal locations of the absent battery cells, there are cell terminals, e.g. cell terminals 890 and 892, ready for the new battery cell insertion.

In one embodiment, if the detection circuit 400 determines that the battery cells 802-1 through 802-N are present in the battery pack 850, the detection circuit 400 enables the cell monitors 802-1 through 802-N and disables cell monitors 802-(N+1) and 802-(N+2). If a cell is not present, the corresponding cell monitor will not be enabled. In one embodiment, if the detection circuit 400 determines that a battery cell is newly inserted into the battery pack 850, the detection circuit 400 enables the corresponding cell monitor to monitor the status of the newly inserted battery cell. As such, only cell monitors corresponding to present battery cells are enabled to improve the power efficiency of the power management system 800.

Figure 9:
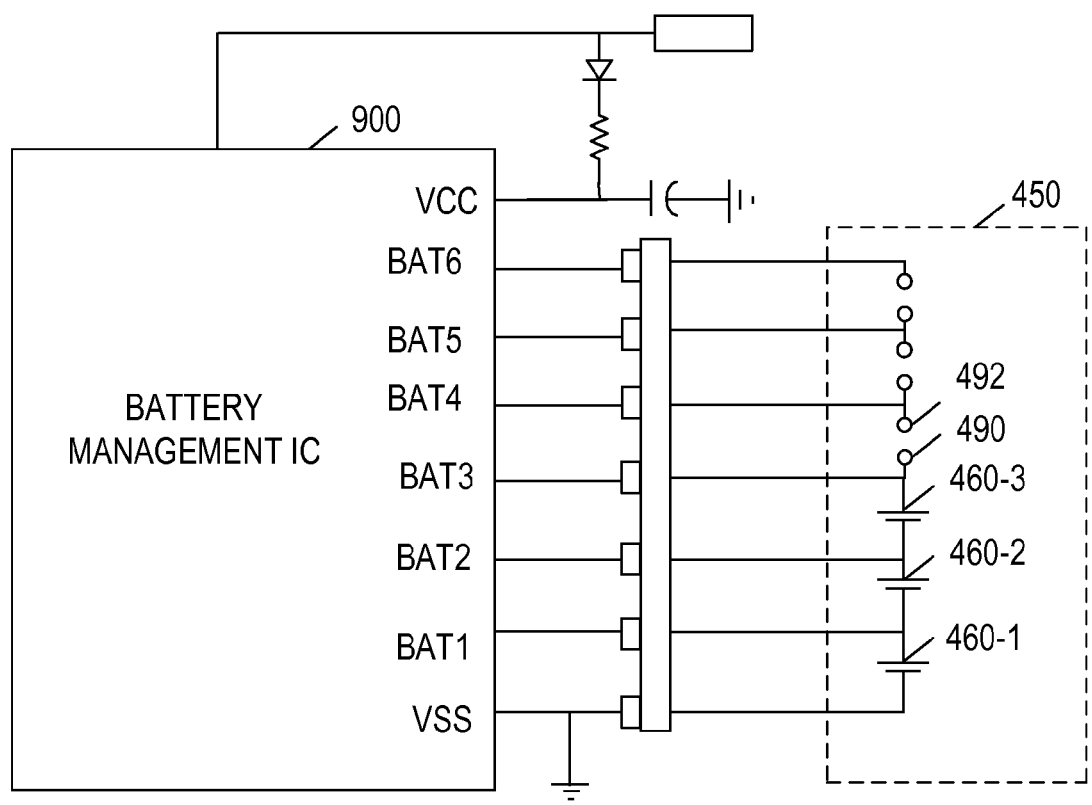
FIG. 9 is a diagram showing a battery management integrated circuit, in accordance with one embodiment of the present invention.

FIG. 9 shows a battery management integrated circuit (IC) 900, according to one embodiment of the present invention. The detection circuit 400 or the battery management system 800 can be integrated into the battery management IC 900. Equipped with the function of cell number detection, the battery management IC 900 achieves a reduced pin count compared with conventional battery management ICs which need pins particularly for cell number configuration.

In the example of FIG. 9, the battery management IC 900 detects that the battery pack 450 includes battery cells 460-1, 460-2 and 460-3. If a fourth battery cell is inserted between the nodes 490 and 492, the battery management IC 900 is also able to detect the fourth cell and to enable the battery cell monitor circuit corresponding to present battery cells accordingly.

Figure 10:
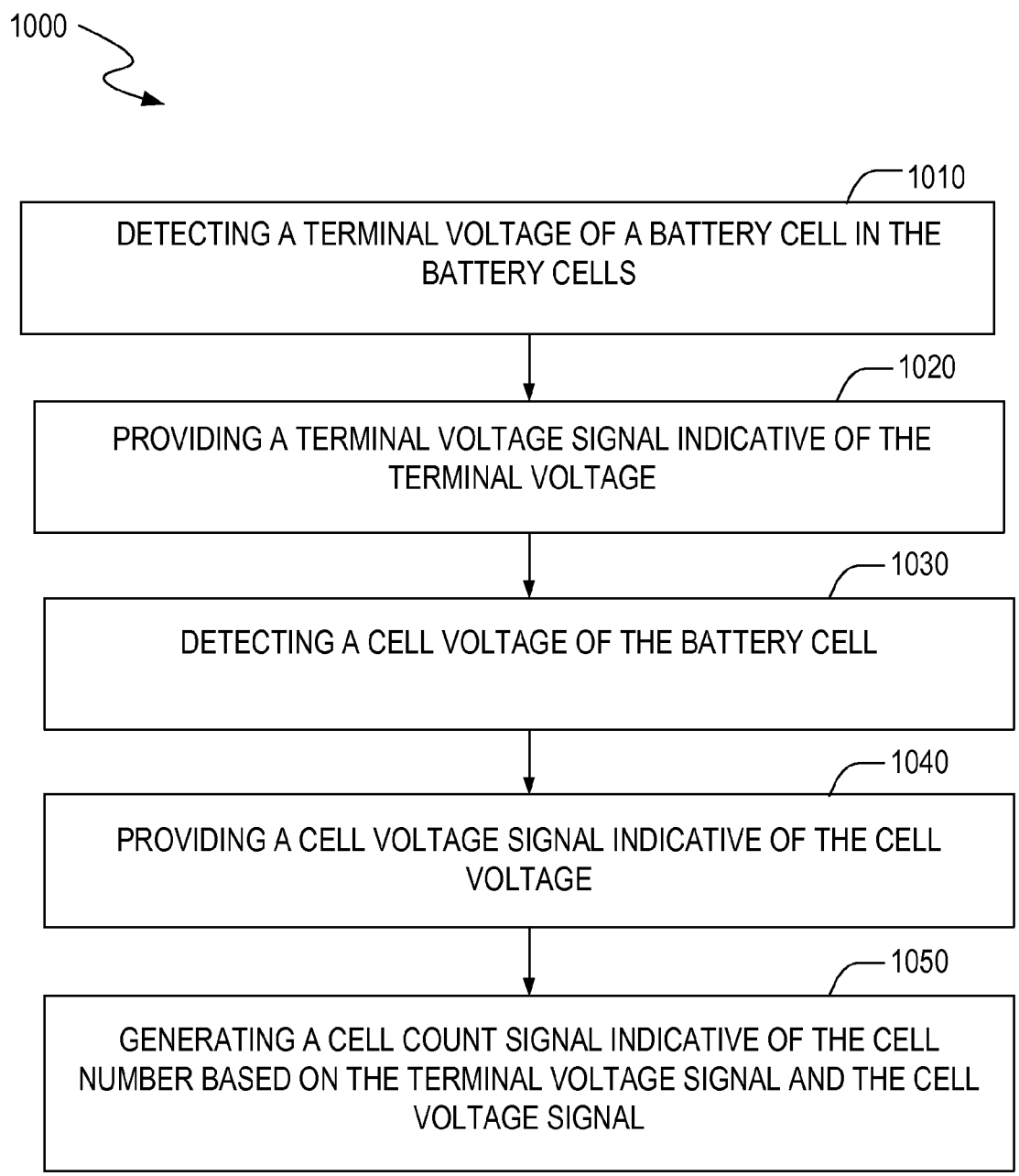
FIG. 10 is a flowchart showing a method for detecting a cell number of a battery pack, in accordance with one embodiment of the present invention.

FIG. 10 is a flowchart 1000 of a method for detecting a cell number of N battery cells. Although specific steps are disclosed in FIG. 10, such steps are exemplary. That is, the present invention is well suited to performing various other steps or variations of the steps recited in FIG. 10.

In block 1010, a terminal voltage of a selected battery cell, e.g., a $K^{th}$ battery cell, is detected. In one embodiment, in a first detection mode, a $K^{th}$ cell node, the positive terminal of the $K^{th}$ battery cell, is coupled to an operational amplifier to detect the terminal voltage of the $K^{th}$ battery cell. In one embodiment, N filter capacitors, each of which is coupled in parallel to one of the N battery cells, are discharged prior to the cell number detection. In block 1020, a terminal voltage signal indicative of the terminal voltage of the $K^{th}$ battery cell is provided. In one embodiment, the terminal voltage signal can be generated by an operational amplifier.

In block 1030, a cell voltage of the $K^{th}$ battery cell is detected. In one embodiment, in a second detection mode, the $K^{th}$ cell node, the positive terminal of the $K^{th}$ battery cell, and a $(K-1)^{th}$ cell node, the negative terminal of the $K^{th}$ battery cell, are coupled to the operational amplifier to detect the cell voltage of the $K^{th}$ battery cell. In block 1040, a cell voltage signal indicative of the cell voltage of the $K^{th}$ battery cell is provided.

In block 1050, a cell count signal indicative of the cell number N based on the terminal voltage signal and the cell voltage signal is generated. In one embodiment, the terminal voltage signal is compared with a first threshold in the first detection mode to determine whether the $K^{th}$ battery cell is in an open circuit condition, and the cell voltage signal is compared with a second threshold in the second detection mode to determine whether the $K^{th}$ battery cell is in a short circuit condition. If the terminal voltage signal is greater than the first threshold and the cell voltage signal is greater than the second threshold, i.e., the $K^{th}$ battery cell is neither in the open circuit condition nor the short circuit condition, the $K^{th}$ battery cell is detected as present. In one embodiment, when the $K^{th}$ battery cell is present while the $(K+1)^{th}$ battery cell is not, the number N is equal to K.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

The invention claimed is:

1. A circuit for determining the number of cells in a plurality of battery cells, said circuit comprising:
a plurality of nodes selectively coupled to said battery cells;
a detection block coupled to said nodes, and configured to provide a terminal voltage signal indicative of a terminal voltage at a first node in said nodes; and
a controller coupled to said detection block and operable for controlling a connection to said first node such that said terminal voltage at said first node is at a first level if there is a battery cell of said battery cells corresponding and coupled to said first node and such that said terminal voltage is at a second level different from said first level if there is not a battery cell corresponding to said first node, said controller further operable for comparing said terminal voltage signal with a first threshold, determining whether said battery cell corresponding and coupled to said first node is present based on said comparing, and providing a cell count signal indicative of said number of cells based on said determining.

2. The circuit of claim 1, wherein said detection block comprises an operational amplifier comprising:
a first input terminal coupled to said first node via a first switch;
a second input terminal coupled to a second node in said nodes via a second switch; and
an output terminal configured to provide said terminal voltage signal if said first switch is on and said second switch is off, and to provide a cell voltage signal indicative of a voltage difference between said first and second nodes if said first and second switches are on.

3. The circuit of claim 1, wherein said detection block comprises:
an operational amplifier coupled to said battery cell and operable for generating said terminal voltage signal and a cell voltage signal indicative of a cell voltage across said battery cell corresponding and coupled to said first node;
a first group of switches configured to couple a plurality of positive terminals of said battery cells to said operational amplifier; and
a second group of switches configured to couple a plurality of negative terminals of said battery cells to said operational amplifier.

4. The circuit of claim 1, wherein said detection block is configured to provide a cell voltage signal indicative of a voltage difference between said first node and a second node in said nodes,
wherein said controller is configured to compare said cell voltage signal with a second threshold,
wherein said controller detects that said battery cell corresponding and coupled to said first node is present if a comparison result of said terminal voltage signal and said first threshold indicates that said terminal voltage is greater than a first reference,
and wherein said controller detects that an abnormal condition is present in said battery cell corresponding and coupled to said first node if a comparison result of said cell voltage signal and said second threshold indicates that said voltage difference is less than a second reference.

5. The circuit of claim 1, further comprising:
a pre-discharging switch coupled in series to said battery cells, and for discharging a plurality of filter capacitors, wherein each of said filter capacitors is selectively coupled in parallel to a corresponding battery cell.

6. The circuit of claim 4, wherein said controller comprises:
a threshold generator operable for generating said first threshold and said second threshold;
a comparator coupled to said threshold generator and for comparing said terminal voltage signal and said cell voltage signal with said first threshold and said second threshold, respectively; and
a counter coupled to said comparator and operable for providing said cell count signal based on a plurality of comparison results from said comparator.

7. The circuit of claim 1, wherein said detection block comprises an amplifier comprising:
a first input terminal coupled to said first node via a first switch;
a second input terminal operable for receiving a voltage reference and clamping a voltage level at said first input terminal to said voltage reference,
wherein said controller is configured to turn on said first switch to discharge charges at said first node to said first input terminal, wherein if said battery cell corresponding and coupled to said first node is present, said terminal voltage is at said first level and said first level is determined by a voltage at a terminal of said battery cell corresponding and coupled to said first node that is greater than said voltage reference, and wherein if there is not a battery cell corresponding to said first node, said terminal voltage is at said second level and said second level is determined by said voltage reference.

8. A monitoring system comprising:
a detection circuit selectively coupled to a battery pack and capable of detecting that said battery pack comprises N battery cells, wherein said detection circuit comprises:
   a plurality of nodes comprising M nodes selectively coupled to said N battery cells, wherein M is a positive integer and N=1, 2 ... M−1;
   a detection block coupled to said nodes and configured to receive a terminal voltage at a first node in said nodes; and
   a controller coupled to said detection block and configured to control a connection to said first node such that said terminal voltage at said first node is at a first level if there is a battery cell in said N battery cells corresponding and coupled to said first node and such that said terminal voltage is at a second level different from said first level if there is not a battery cell corresponding to said first node, and said controller further configured to determine whether said battery cell corresponding and coupled to said first node is present according to a comparison between said terminal voltage and a first reference, and configured to generate a cell count signal indicative of said cell number N according to the determining;
a plurality of cell monitors comprising M cell monitors, wherein each of said cell monitors is configured to monitor a battery cell; and
a switching circuit coupled to said detection circuit and operable for enabling N cell monitors of said plurality of cell monitors and coupling the enabled N cell monitors to said N battery cells respectively.

9. The monitoring system of claim 8, wherein said detection block is operable for detecting whether a $K^{th}$ battery cell is present, where K=1, 2 ... M−1, and for providing a status signal indicative of whether said $K^{th}$ battery cell is present, and wherein said controller is operable for calculating said number N based on said number K and said status signal.

10. The monitoring system of claim 9, wherein said status signal indicates that said $K^{th}$ battery cell is present if a terminal voltage at a node, which is a node of said nodes and corresponding to said $K^{th}$ battery cell, is greater than said first reference and a cell voltage across said $K^{th}$ battery cell is greater than a second reference.

11. The monitoring system of claim 9, wherein said detection block detects whether a $(K+1)^{th}$ battery cell is present if said status signal indicates that said $K^{th}$ battery cell is present, and wherein said number N is equal to K if there is not a $(K+1)^{th}$ battery cell.

12. The monitoring system of claim 9, wherein said detection block detects whether a $(K-1)^{th}$ battery cell is present if said status signal indicates that there is not a $K^{th}$ battery cell, and wherein said number N is equal to K−1 if said $(K-1)^{th}$ battery cell is present.

13. The monitoring system of claim 8, wherein said enabled N cell monitors monitor currents of said N battery cells respectively.

14. The monitoring system of claim 8, wherein said enabled N cell monitors monitor temperatures of said N battery cells respectively.

15. The monitoring system of claim 8, wherein said detection block comprises an amplifier comprising:
   a first input terminal coupled to said first node via a first switch;
   a second input terminal operable for receiving a voltage reference and clamping a voltage level at said first input terminal to said voltage reference,
   wherein said controller is configured to turn on said first switch to discharge charges at said first node to said first input terminal,
   wherein if said battery cell corresponding and coupled to said first node is present, said terminal voltage is at said first level and said first level is determined by a voltage at a terminal of said battery cell corresponding and coupled to said first node that is greater than said voltage reference,
   and wherein if there is not a battery cell corresponding to said first node, said terminal voltage is at said second level and said second level is determined by said voltage reference.

16. A method for determining the number of cells in a plurality of battery cells, said method comprising:
   receiving a terminal voltage at a first node in a plurality of nodes, said nodes selectively coupled to said battery cells;
   controlling a connection to said first node such that said terminal voltage at said first node is at a first level if there is a battery cell in said battery cells corresponding and coupled to said first node and such that said terminal voltage is at a second level different from said first level if there is not a battery cell corresponding to said first node;
   determining whether said battery cell corresponding and coupled to said first node is present based on comparison between said terminal voltage and a first reference; and
   generating a cell count signal indicative of said number of cells based on said determining.

17. The method of claim 16, further comprising:
   discharging a plurality of filter capacitors selectively coupled in parallel to said battery cells.

18. The method of claim 16, further comprising:
   comparing a terminal voltage signal indicative of said terminal voltage to a first threshold; and
   comparing a cell voltage signal indicative of a voltage difference between said first node and a second node in said nodes to a second threshold.

19. The method of claim 18, further comprising:
   determining that a battery cell is present and coupled between said first and second nodes if a result of said comparing of said terminal voltage signal and said first threshold and said comparing of said cell voltage signal and said second threshold indicates that said terminal voltage is greater than said first reference and said voltage difference is greater than a second reference.

20. The method of claim 16, wherein said controlling said connection to said first node comprises:
   clamping a voltage at a terminal to a voltage reference;
   discharging charges at said first node to said terminal;
   controlling said terminal voltage to said first level if said battery cell corresponding and coupled to said first node is present, wherein said first level is determined by a voltage at a terminal of said battery cell corresponding and coupled to said first node that is greater than said voltage reference; and controlling said terminal voltage to said second level by said discharging if there is not a battery cell corresponding to said first node, wherein said second level is determined by said voltage reference.

\* \* \* \* \*